United States Patent
De Carolis et al.

(10) Patent No.: US 10,555,432 B2
(45) Date of Patent: Feb. 4, 2020

(54) VALVE MANIFOLD SERIALLY MOUNTED TO A DISTRIBUTED CONTROL SYSTEM ASSEMBLY

(71) Applicant: Asco, L.P., Novi, MI (US)

(72) Inventors: Enrico De Carolis, Oakland Township, MI (US); John F. Eskew, Phoenix, AZ (US); Gregory A. Wells, Glendale, AZ (US)

(73) Assignee: Asco, L.P., Novi, MI (US)

(*) Notice: Subject to any disclaimer, the term of this patent is extended or adjusted under 35 U.S.C. 154(b) by 0 days.

(21) Appl. No.: 15/765,825

(22) PCT Filed: Oct. 8, 2015

(86) PCT No.: PCT/US2015/054701
§ 371 (c)(1),
(2) Date: Apr. 4, 2018

(87) PCT Pub. No.: WO2017/062013
PCT Pub. Date: Apr. 13, 2017

(65) Prior Publication Data
US 2019/0116681 A1    Apr. 18, 2019

(51) Int. Cl.
*H01R 9/22* (2006.01)
*H05K 7/14* (2006.01)

(52) U.S. Cl.
CPC ........ *H05K 7/1479* (2013.01); *H05K 7/1467* (2013.01)

(58) Field of Classification Search
CPC ... H05K 7/1479; H05K 7/1475; H05K 7/1467

USPC ........................................ 439/717
See application file for complete search history.

(56) References Cited

U.S. PATENT DOCUMENTS

| | | |
|---|---|---|
| 7,182,102 B2 | 2/2007 | Kärcher |
| 7,753,740 B2 | 7/2010 | De Carolis et al. |
| 7,896,711 B2 | 3/2011 | De Carolis et al. |
| 8,219,253 B2 | 7/2012 | Arbter et al. |
| 8,442,663 B2 | 5/2013 | Aneweer et al. |
| 2002/0119706 A1 | 8/2002 | Sagues et al. |
| 2005/0028037 A1 | 2/2005 | Junk et al. |
| 2006/0092039 A1 | 5/2006 | Saito et al. |
| 2008/0189441 A1 | 8/2008 | Jundt et al. |
| 2009/0088874 A1 | 4/2009 | Arceo et al. |
| 2010/0057262 A1 | 3/2010 | Boger |
| 2012/0078391 A1 | 3/2012 | Zornio et al. |
| 2013/0282150 A1 | 10/2013 | Panther et al. |

FOREIGN PATENT DOCUMENTS

WO    WO2015007297 A1    1/2015

OTHER PUBLICATIONS

PCT International Search Report and Written Opinion, PCT Application No. PCT/US2015/054701, filed Oct. 8, 2015, 16 Pages.

*Primary Examiner* — Khiem M Nguyen
(74) *Attorney, Agent, or Firm* — Reising Ethington P.C.

(57) ABSTRACT

A control system has an I/O bank with a communication module controlling a plurality of Input/Output modules operably connected to its communication backplane and a valve manifold having a communication module serially connected to the backplane of the I/O bank. The I/O bank with a plurality of Input/Output modules is constructed to be connected to a plurality of field sensors or loads. The valve manifold with a plurality of solenoid valves is constructed to be pneumatically connected to a plurality of field devices.

16 Claims, 6 Drawing Sheets

VALVE MANIFOLD SERIALLY MOUNTED TO A DISTRIBUTED CONTROL SYSTEM ASSEMBLY

TECHNICAL FIELD

The field of this invention relates to an electrical bus system that has a solenoid valve manifold that is serially connected to a distributed control system via a distribution I/O system.

BACKGROUND OF THE DISCLOSURE

Industrial automation uses many control devices. One useful control device is a solenoid valve manifold, often simply referred to as a valve manifold, that houses a plurality of electrically actuated solenoid valves. The solenoid valves control the direction of hydraulic or pneumatic flow for actuating other downstream field devices, for example process valves. These valve manifolds have communication modules that often mount adjacent the solenoid valve stations, and connect to various fieldbus networks.

These fieldbus networks have become commonplace in automation control. The fieldbus network provides remote control over the valve stations. Typical fieldbus networks may use EtherNet/IP™, FIPIO™, Interbus-S™, ControlNet™ DeviceNet™ or other proprietary or open network protocols. The valve manifold is connected to a fieldbus network usually mastered by a remote programmable logic controller (PLC), industrial personal computer (IPC), and/or distributed control system (DCS). As used herein, the term distributed control system (DCS) is generic in nature and also includes PLCs and IPCs.

It is also common to have side by side network architecture as illustrated in FIG. 1, i.e., a fieldbus 11 that is connected to the valve manifold is parallel to another fieldbus network 13 with respect to a DCS 18. The DCS 18 may be a commercially available DeltaV™ DCS. A bank of Input/Output modules (I/O bank) 14, that uses a proprietary Ethernet connection as an example, is connected remotely from the DCS 18 to ethernet master unit 15 in the DCS 18. The I/O bank may be a commercially available CHARM™ I/O bank 14 connected to a plurality of field devices, i.e. sensors 24 that send back signals for various parameters sensed at process valves 44 or loads that may include valves. The I/O bank 14 can receive signals from the sensors and relays the signals in the fieldbus network 13 to the DCS 18. Valve manifolds 10 are connected to a master unit 12 in DCS 18. Valve manifold 10 is pneumatically operably connected to the plurality of process valves 44. The valve manifold 10 is connected in parallel to the DCS 18 relative to the I/O bank 14 via a different network 11, e.g. Profibus-DP. Both master unit 12 and ethernet network master 15 are controlled by DCS 18. In this fashion, the valve manifold and I/O bank work in parallel, side by side, using their own respective fieldbus networks 11 and 13 and respective protocols.

This standard prior art system uses one protocol network for controlling the valves, but uses another network to verify valve positions and other parameters via sensors. The use of two networks to coordinate the valves and sensors adds a level of undesirable complexity.

Coordination of valve and I/O control can be achieved by connecting each valve manifold station through a CHARM I/O module, each module having with its own microprocessor. This connection method, however, is expensive and labor intensive by the need to wire a separate CHARM I/O module with its own microprocessor to each solenoid valve of each valve station on the manifold.

What is needed is a more expeditious arrangement where the valve manifold is connected to the I/O bank 14 and logically becomes an integral part of the I/O bank as if the valves where physically part of the I/O bank such that the DCS can control the valve manifold and I/O bank as if they were one unit, using the I/O bank's existing backplane protocol and also allowing the DCS to decode diagnostic information available via the valve manifold's communication module for the valves and manifold system.

SUMMARY OF THE DISCLOSURE

In accordance with one aspect of the invention, a control system has a distributed control system (DCS) connected to an I/O bank that has a communication module. A plurality of input-output modules of the I/O bank are operably connected to and mastered by the remote I/O bank's communication module for control of its I/O modules. A valve manifold having a manifold communication module for controlling a plurality of valve stations is also operably connected to the I/O bank using the same protocol of the I/O bank. Preferably, the I/O modules and manifold communication modules are connected to the communication module through a backplane of the I/O bank. The I/O bank is constructed to be connected to a plurality of field sensors and/or loads. The valve manifold is constructed to be pneumatically connected to a plurality of field devices. The field device may be process valves and the field sensors may be appropriate for sensing various parameters, e.g. process valve position, pressure flow, temperature at the process valves or in the process system.

Preferably, the I/O bank and valve manifold are housed in a single cabinet. Preferably, the valve manifold has pneumatic fittings extending through a wall of the cabinet.

In an alternate embodiment, the I/O bank and the valve manifold are housed in separate cabinets. A cable for providing communication and power extends from the I/O bank in one cabinet to the valve manifold in the other cabinet. Preferably, the valve manifold has pneumatic fittings extending through a wall of the other cabinet.

According to another aspect of the invention, a control system has a communication module operably connected to an I/O bank with a plurality of Input/Output modules. A valve manifold has a manifold communication module operably connected to a plurality of valve stations and serially connected to the backplane of the communication module of the I/O bank using the same protocol as the backplane. The Input/Output modules are constructed to be connected to a plurality of field sensors and/or loads. The valve manifold is constructed to be pneumatically connected to a plurality of field devices. The I/O bank and the valve manifold are housed in a single cabinet.

In accordance with another aspect of the invention, a control system has a DCS connected to an I/O bank with a plurality of Input/Output modules operably connected to a communication backplane mastered by the I/O bank's communication module for controlling the plurality of its Input/Output modules. A valve manifold having a manifold communication module for controlling a plurality of valve stations is operably connectable to a plurality of field devices preferably through a pneumatic connection. The manifold communication module is serially connected to the I/O bank's communication backplane through a single communication cable. A second redundant cable for safety may also be connected. The Input/Output modules of the I/O bank are constructed to be connected to a plurality of field sensors and/or loads.

Preferably, each Input/Output module of the I/O bank has a microprocessor therein. The manifold communication module has a microprocessor programmed to emulate a plurality of microprocessors of the Input/Output modules connected to the communication backplane of the I/O bank.

In one embodiment, the manifold communication module has power supplied from the I/O backplane through a cable. The cable also preferably provides communication.

In one embodiment, a redundant cable also supplies redundant power and redundant communication.

In accordance with another aspect of the invention, a second communication module may be installed on the same network with the I/O bank and its backplane. The valve manifold communication module is connected to the second communication module and is constructed to emulate a plurality of Input/Output module microprocessors and control a plurality of valves.

BRIEF DESCRIPTION OF THE DRAWINGS

Reference now is made to the accompanying drawings in which.

DETAILED DESCRIPTION OF THE PREFERRED EMBODIMENT

Figure 1:
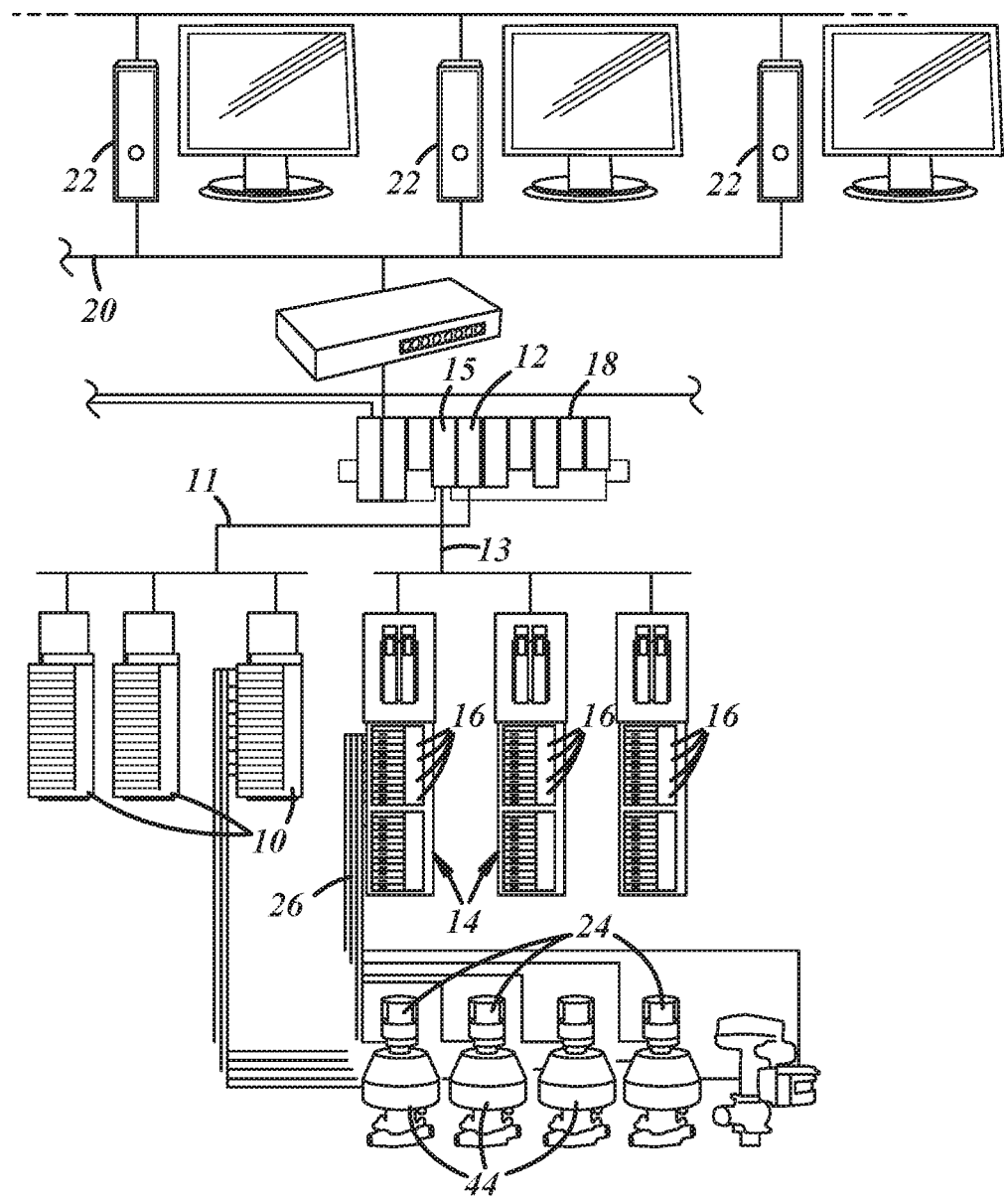
FIG. 1 is a schematic chart of a prior art control system with a DCS which communicates in parallel to a valve manifold and an I/O bank using two separate fieldbus networks.
Figure 2:
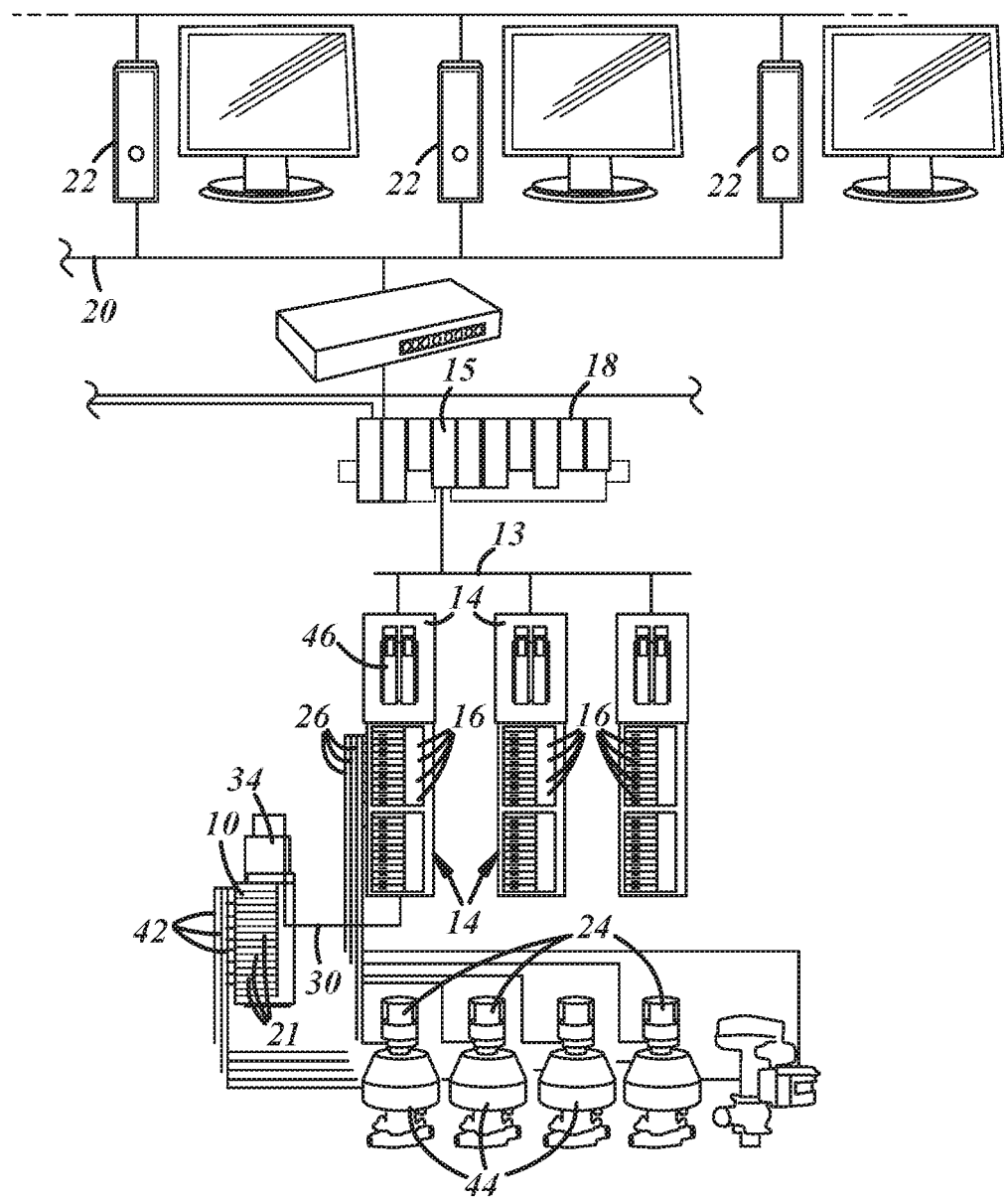
FIG. 2 is a schematic chart showing a valve manifold serially connected to an I/O bank which is in turn connected to a DCS via a communication network in accordance with an embodiment of the invention.

Referring now to FIG. 2, a control network 20 has a plurality of work stations 22 connected to a DCS 18. The DCS may be a commercially available DELTAV™ system from Emerson Process Management. The DCS 18 is in turn connected through its network 13 to one or more I/O banks 14 containing individual Input/Output modules 16. A suitable bank of I/Os may be the commercially available CHARM™ I/O bank from Emerson Process Management. These I/O banks 14 may be remotely positioned from the DCS 18.

Figure 3:
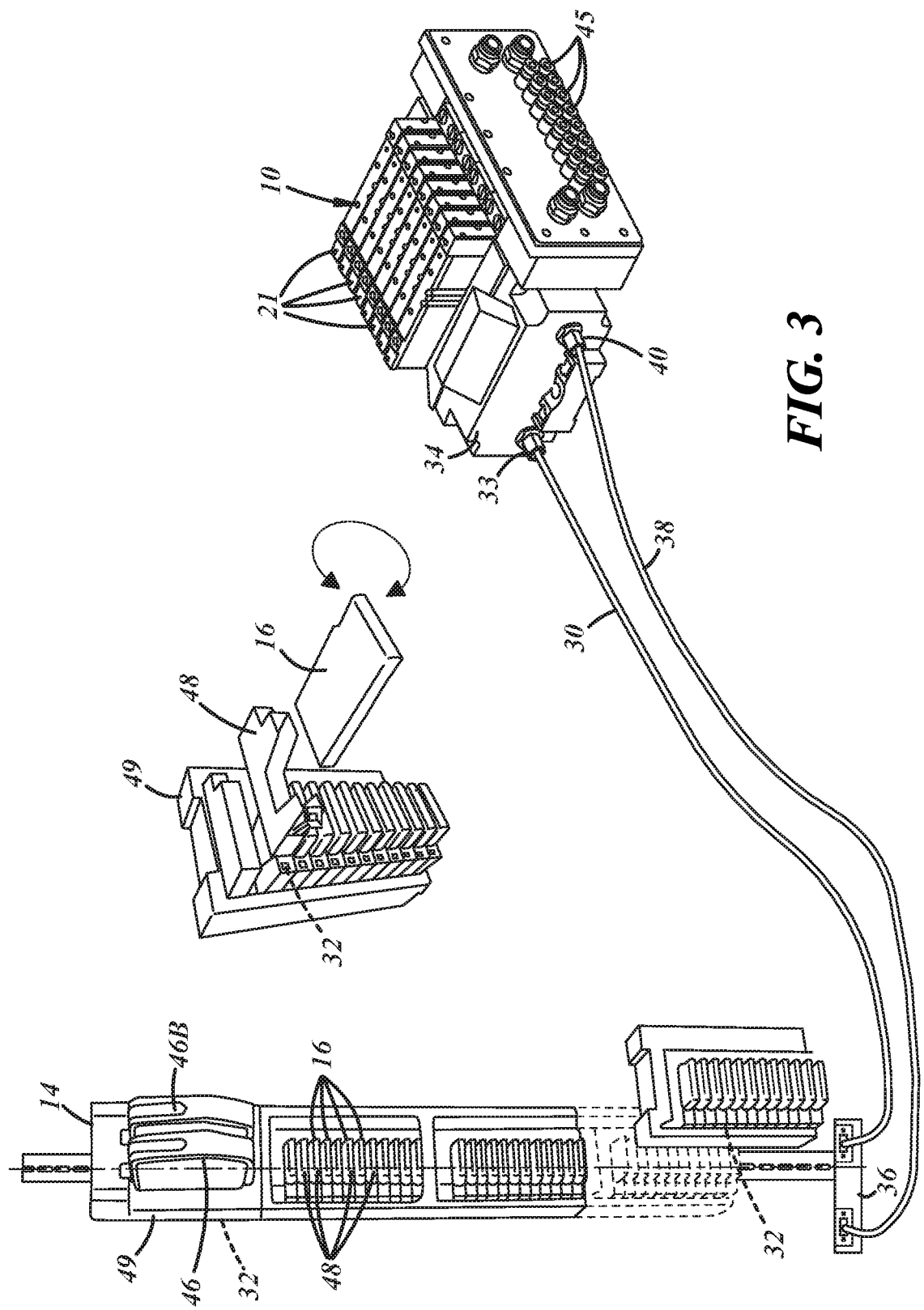
FIG. 3 is a fragmented and enlarged schematic showing the I/O bank and the valve manifold connected in series as shown in FIG. 2 with redundant backplane communication.

Many of the individual I/O modules 16 in the bank may be connected to field sensors 24 through cables 26 for receiving information from the field sensors 24. In addition, a valve manifold 10 may also be connected to the I/O bank 14. Preferably, as illustrated in FIG. 3, the connection is made by extending a cable 30 that integrates both power and communication from a backplane 32 of the I/O bank 14 to the communication fitting 33 of a communication module 34 of the valve manifold 10. More specifically, the power and communication cable 30 extends from the fitting 33 of the valve manifold 10 to a column extender 36 that connects the backplane 32 of the I/O bank 14. A redundant integrated power and communication cable 38 is also installed to fitting 40 in case cable 30 fails. In certain commercially available embodiments, the cable 30 only provides communication and cable 38 only provides power.

The valve manifold 10 has its plurality of valve stations 21 attached to pneumatic fittings 45 that are connected to a plurality of pneumatic tubes 42 as shown in FIG. 2 which in turn are operably connected to field devices 44 for example process valves. As shown in FIG. 3, cables 30 and 38 extend from the I/O bank 14 to the valve manifold 10 and the pneumatic tubes 42 extend from the valve manifold 10 to the field devices 44 in FIG. 2. The field sensors 24 may be operably connected to the field devices 44 for sensing one or more parameters, e.g. process valve position, pressure at the field devices 44 and are connected through cables 26 directly back to the I/O bank 14 bypassing the valve manifold 10 and its communication module 34. The field sensor may also sense other parameters, such as temperature and flow rate at other locations in the process system remote from the field devices.

The I/O bank 14 may have a communication module 46 connected to a DCS 18 for control and communication with the I/O modules 16 via backplane 32 as shown in FIG. 3. A redundant communication module 46B may be mounted adjacent module 46 for safety and redundancy. The redundant communication module 46B may be on a redundant network 53 as more clearly shown in FIG. 4. The advantage of the using the CHARM™ system is that each individual replaceable card 16 for each I/O can be fitted into the housing 48 as shown in FIG. 3 to commission the I/Os 16 to either an input or an output position without changes to the hard wiring in its housing 48 or base plate 49, i.e. it performs electronic marshalling for all the signals coming in or emanating from the I/O modules 16 of bank 14.

By having the manifold communication module 34 connected to the backplane 32 of the I/O bank 14, the valve manifold 10 is directly in communication with the communication module 46 of the I/O bank 14 and, therefore, seamlessly controlled by the DCS 18. In other words, the valve manifold has a communication module which translates the serial backplane protocol of the I/O bank, so the DCS 18 can seamlessly control the valve manifold.

By using the same protocols in both the manifold communication module 34 of the valve manifold 10 and the backplane communication of I/O bank 14, the valve manifold 10 may "piggyback" onto the I/O bank 14 and enhance the functionality of the I/O bank 14 by adding valve capabilities to the I/O bank. The single microprocessor of the manifold communication module 34 emulates multiple Input/Output module 16 microprocessors and thus, the communication module 46 reads the signals from the manifold communication module 34 as if they were signals from the different Input/Output modules 16. While it is known that an IC chip with a CPU on it is called a microprocessor, a single IC chip may also include I/O pins, RAM, ROM and other components. These single IC chips are commonly called microcontrollers. Microprocessors, as used herein, include IC chips now commonly referred to as microcontrollers.

Furthermore, the piggybacking of the valve manifold onto the I/O bank eliminates the need for additional dedicated networks for solenoid valve manifolds. There is no further need for a second fieldbus network, e.g., DeviceNet/Profibus-DP/AS-Interface, etc. and, thus, the number of fieldbus networks is reduced for the entire control system in FIG. 2.

The wiring is also reduced by providing only a single network cable 13 connecting the field junction box, i.e. the communication module 34 back to the distributed control system 18 for both the I/O bank 14 and the solenoid valve manifold 10.

A single connection to the I/O bank 14 from the DCS 18 allows for a tightly integrated solution with no need for additional software configuration tools. Both the I/O bank 14 and valve manifold 10 provide a single point for a user to control of products, documentation and diagnostics. All the configuration work can be done via the DCS 18.

The diagnostics of the valve manifold are available via the DCS. The valves in the valve manifold are sensed by the DCS and are available with the same distributed control system diagnostics application that is used for other field devices connected to the I/O bank or to the DCS.

Figure 4:
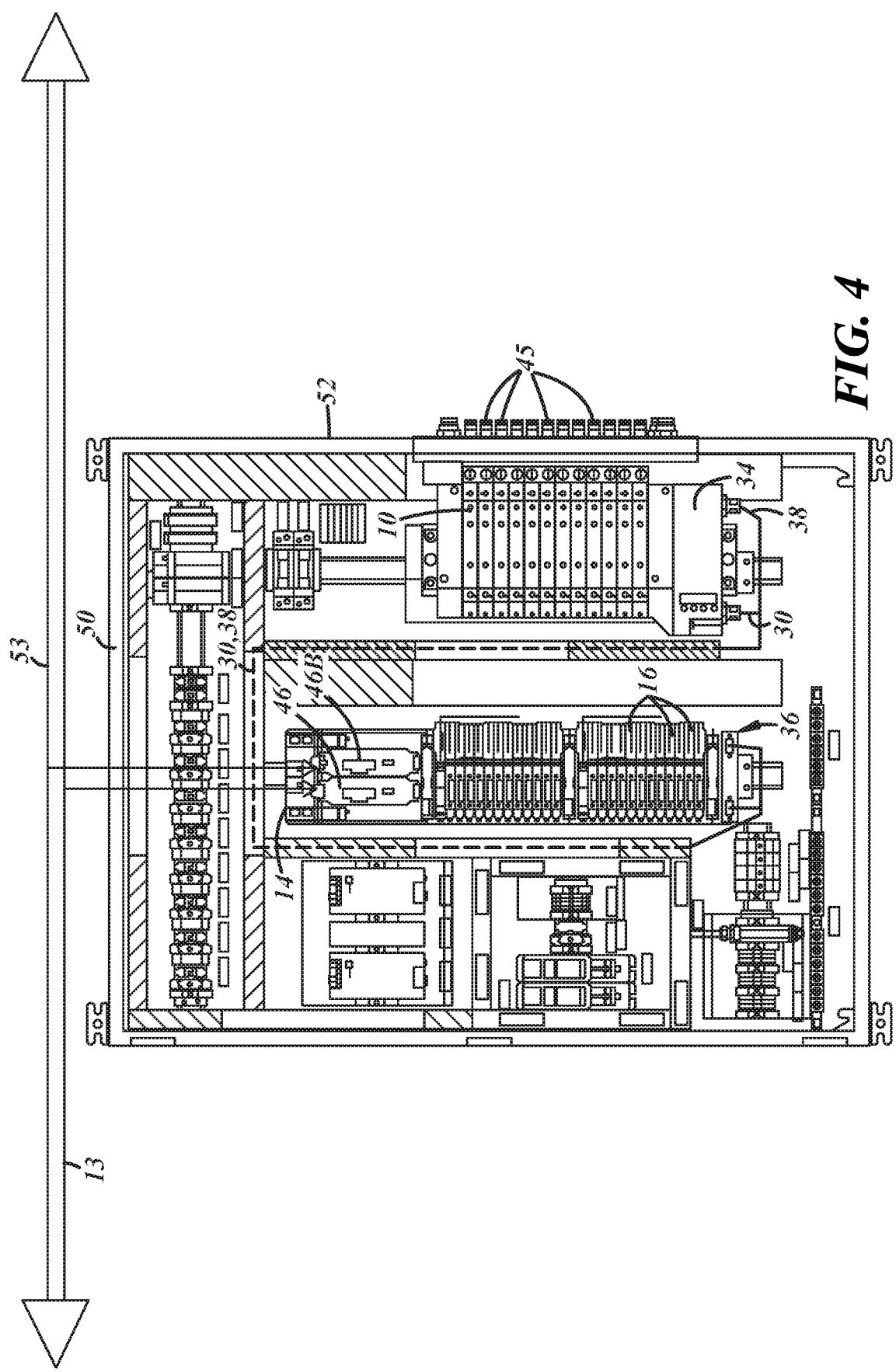
FIG. 4 is a plan view showing the I/O bank and the valve manifold connected in series and both housed in a single cabinet housing.
Figure 5:
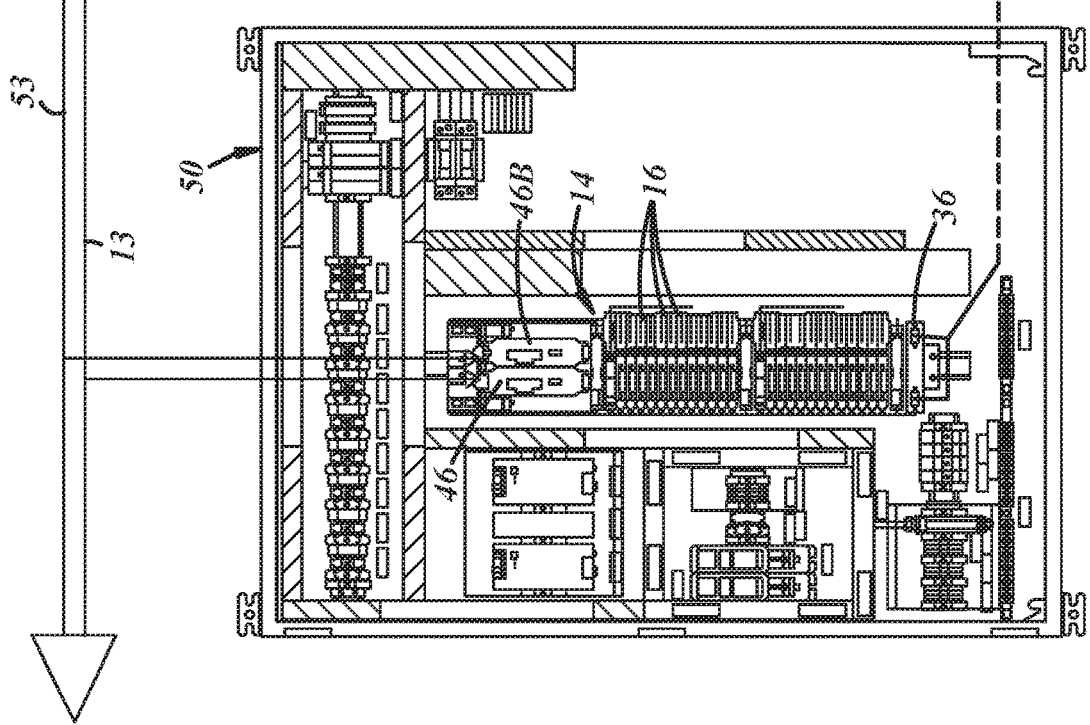
FIG. 5 is an alternate embodiment where the valve manifold and the I/O bank are connected in series and mounted in separate proximately located cabinets.
Figure 5:
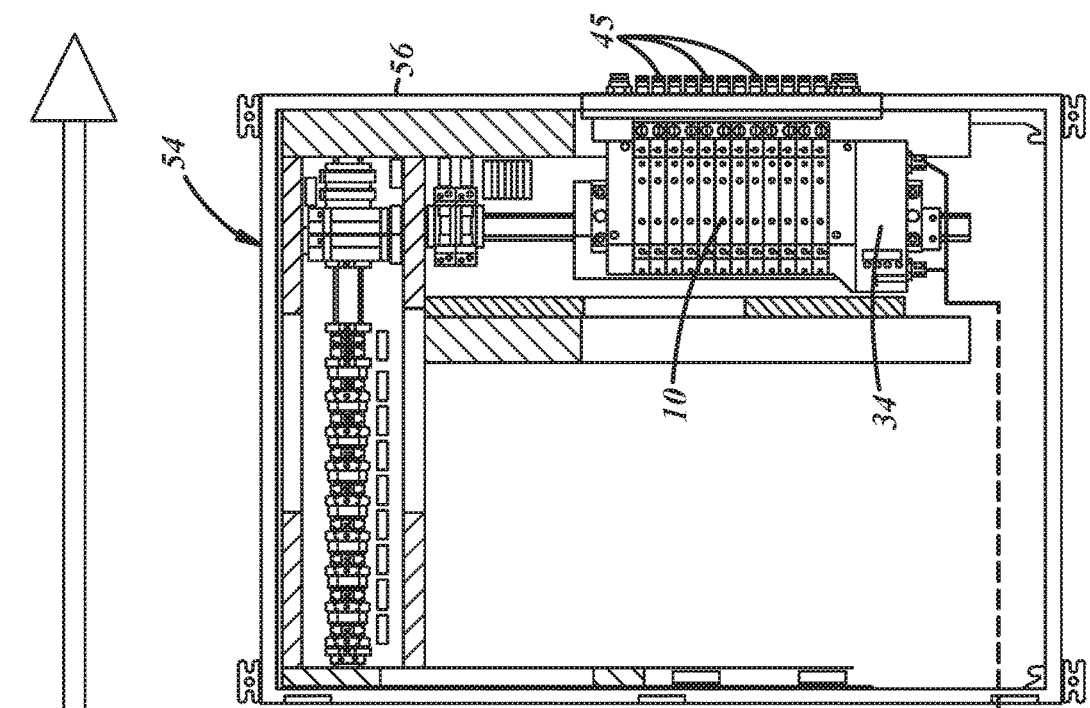

FIGS. 4 and 5 illustrate different cabinet configurations for the use of the I/O bank 14 and valve manifold 10 shown in FIGS. 2 and 3. FIG. 4 illustrates a typical installation of a single cabinet 50 housing both the I/O bank 14 and the valve manifold 10. The cables 30 and 38 extend from a column extender 36 at the I/O bank 14 and connect to the communication module 34 of the valve manifold 10. In this illustrated embodiment, the pneumatics fittings 45 of the valve manifold 10 extend out of a side 52 of the cabinet 50.

FIG. 5 illustrates the I/O bank 14 mounted in cabinet 50 while the valve manifold 10 is mounted in a separate second cabinet 54. The cabinets 50 and 54 are mounted a short enough distance from each other to allow the cables 30 and 38 to extend from the column extender 36 and out of the cabinet 50 to cabinet 54 where it is connected to the communication module 34 for the valve manifold 10. The pneumatic fittings 45 extend out of side 56 of the cabinet 54. This embodiment is preferred when the pneumatic system is remote from the cabinet 50.

Figure 6:
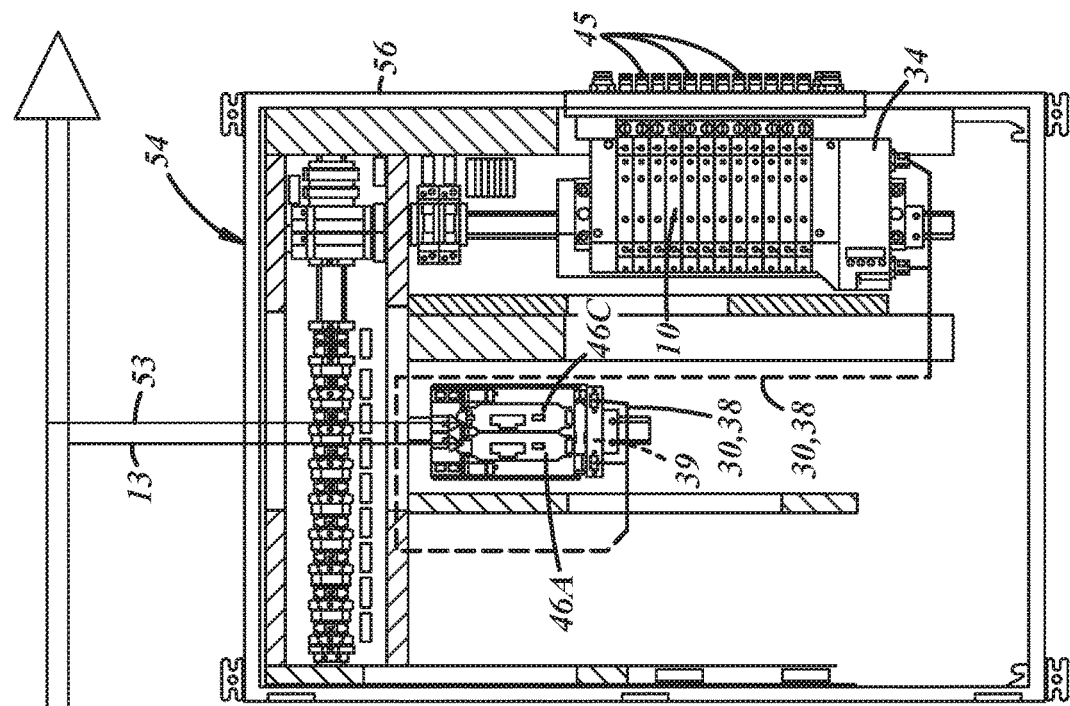
FIG. 6 is an alternate embodiment where the valve manifold and the I/O bank are mounted in separate remote cabinets where the valve manifold is serially connected to a remote I/O bank without any Input/Output cards.
Figure 6:
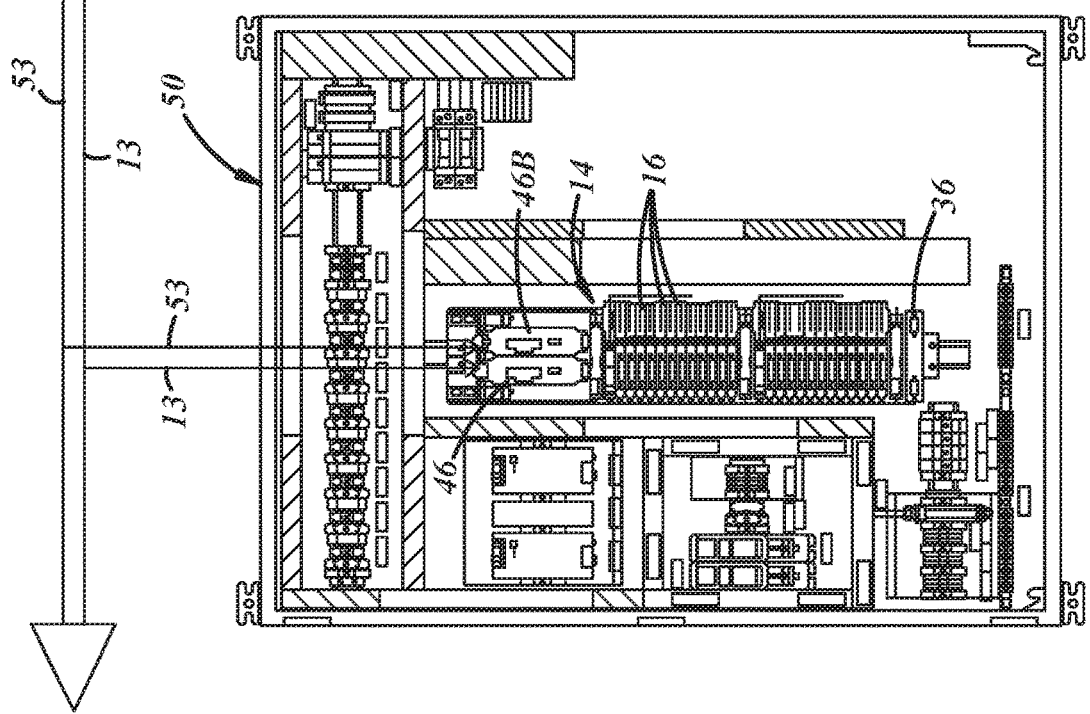

FIG. 6 illustrates separate cabinets 50 and 54 where the cabinets are mounted a farther distance with respect to each other than the cabinets shown in FIG. 5. In this embodiment, the I/O bank 14 is mounted in cabinet 50 and the valve manifold 10 is mounted in the second cabinet 54. Power is separately supplied to the second cabinet 54 (not shown). Communication is supplied via network 13 to a second communication module 46A without I/O modules 16 that is mounted in cabinet 54. The second communication module 46A is also mounted to connect to network 13 of DCS 18. A redundant communication module 46C may be mounted adjacent a second communication module 46A and connected to redundant network 53 for meeting safety protocols. The power and communication cables 30 and 38 extend from the I/O bank backplane 32 to connect communication modules 46 and 46A to the communication module 34 of the valve manifold 10 for controlling the valve manifold 10. The pneumatic fittings 45 extend out of side wall 56.

As shown in FIG. 6, a communication module 46 need not be connected to any Input/Output module 16, but the advantage of using the I/O bank backplane to serially connect to valve manifold 10 via communication module 34 still provides the advantage of using a single network 13 for both the I/O units and manifold valves and eliminating a separate network 11.

Other variations and modifications are possible without departing from the scope and spirit of the present invention as defined by the appended claims.

The embodiments in which an exclusive property or privilege is claimed are defined as follows:

1. A control system comprising:
   a distributed control system connected to an I/O bank;
   said I/O bank has a communication module controlling a plurality of Input/Output (I/O) modules operably connected via a protocol to the communication module;
   a valve manifold with a manifold communication module for controlling a plurality of valve stations remotely from the I/O bank and serially connected to the communication module of the I/O bank and using the same protocol as said I/O bank whereby said I/O bank provides valve manifold control;
   said valve manifold being constructed to be pneumatically connected to a plurality of pneumatically controlled field devices having one of electric field sensors and loads;
   the I/O bank constructed to be connected to said one of electric field sensors and loads; and
   at least one of said valve manifold and said I/O bank with a plurality of Input/Output modules being housed in a cabinet.

2. A control system as defined in claim 1 further comprising:
   said I/O bank with a plurality of Input/Output modules and said valve manifold being housed in the same cabinet.

3. A control system comprising:
   a distributed control system connected to an I/O bank;
   said I/O bank has a communication module controlling a plurality of Input/Output modules operably connected via a protocol to the communication module;
   a valve manifold with a manifold communication module for controlling a plurality of valve stations remotely and serially connected to the communication module of the I/O bank and using the same protocol as said I/O bank;
   said valve manifold being constructed to be pneumatically connected to a plurality of pneumatically controlled field devices having one of electric field sensors and loads operably connected thereto;
   the I/O bank constructed to be connected to said electric field sensors or loads of said plurality of field devices;
   at least one of said valve manifold and said I/O bank with a plurality of Input/Output modules being housed in a cabinet;
   said I/O bank with a plurality of Input/Output modules and said valve manifold being housed in a single cabinet and
   said valve manifold having pneumatic outlets extending through a wall of said single cabinet.

4. A control system as defined in claim 3 further comprising:
   said valve manifold and said I/O bank with a plurality of Input/Output modules and being housed in separate cabinets; and
   a cable for providing communication and power extending from the I/O bank in one cabinet to the valve manifold in said other cabinet.

5. A control system as defined in claim 4 further comprising:
   said valve manifold having pneumatic outlets extending through a wall of said other cabinet.

6. A control system comprising:
   a distributed control system connected to an I/O bank;
   said I/O bank has a communication module controlling a plurality of Input/Output modules operably connected via a protocol to the communication module;

a valve manifold with a manifold communication module for controlling a plurality of valve stations remotely and serially connected to the communication module of the I/O bank and using the same protocol as said I/O bank;

said valve manifold being constructed to be pneumatically connected to a plurality of pneumatically controlled field devices having one of electric field sensors and loads operably connected thereto;

the I/O bank constructed to be connected to one of said electric field sensors and loads of said plurality of field devices;

at least one of said valve manifold and said I/O bank with a plurality of Input/Output modules being housed in a cabinet said valve manifold and said I/O bank with a plurality of Input/Output modules being housed in separate cabinets; and a cable for providing communication and power extending from the I/O bank in one cabinet to the valve manifold in said other cabinet.

7. A control system comprising:
a distributed control system connected to an I/O bank;
said I/O bank has a communication module controlling a plurality of Input/Output modules operably connected via a protocol to the communication module;
a valve manifold with a manifold communication module for controlling a plurality of valve stations remotely and serially connected to the communication module of the I/O bank and using the same protocol as said I/O bank;
said valve manifold being constructed to be pneumatically connected to a plurality of pneumatically controlled field devices having one of electric field sensors and loads operably connected thereto;
the I/O bank constructed to be connected to said one of electric field sensors and loads of said plurality of field devices;
at least one of said valve manifold and said I/O bank with a plurality of Input/Output modules being housed in a cabinet; and
said I/O bank having a backplane that operably connects to said plurality of Input/Output modules, said communication module and said manifold communication module whereby said I/O bank provides valve manifold control.

8. A control system comprising:
a communication module having an I/O bank with a plurality of Input/Output modules and controlling said plurality of Input/Output modules via a protocol;
a valve manifold having a manifold communication module serially and remotely connected to the communication backplane of the I/O bank using the same protocol as the communication backplane for controlling a plurality of valve stations whereby said I/O bank provides valve manifold control;
said I/O bank with plurality of Input/Output modules constructed to be connected to a plurality of electric field sensors or loads for a plurality of pneumatically controlled field devices;
said valve manifold being constructed to be pneumatically connected to said plurality of pneumatically controlled field devices; and said I/O bank and said valve manifold being housed in a cabinet.

9. A control system as defined in claim 8 further comprising:
said valve manifold having pneumatic outlets extending through a wall of said cabinet.

10. A control system comprising:
a distributed control system connected to an I/O bank;
said I/O bank having a communication module controlling a plurality of Input/Output modules operably connected to its communication backplane;
a valve manifold with a manifold communication module for controlling a plurality of valve stations operably connected to a plurality of field devices having its manifold communications module serially connected to the communication backplane of the I/O bank through a single cable or through a second cable for redundant communication;
the Input/Output modules of said I/O bank with a plurality of Input/Output modules constructed to be connected to a plurality of field sensors or loads; and
said valve manifold being constructed to be pneumatically connected to a plurality of field devices.

11. A control system as defined in claim 10 further comprising:
each Input/Output module of said I/O bank having a microprocessor therein; and
said manifold communication module having a microprocessor constructed to emulate a plurality of said microprocessors of each Input/Output module therein and connected to the I/O bank's communication backplane and controlling said plurality of field devices.

12. A control system as defined in claim 11 further comprising:
said manifold communication module having power supplied from said backplane of said I/O bank through said cable.

13. A control system as defined in claim 12 further comprising;
said second cable also connected to supply redundant power from said backplane.

14. A control system as defined in claim 12 further comprising: said I/O bank and said valve manifold being housed in separate cabinets; and
said single cable extending from the I/O bank in one cabinet to the valve manifold in said other cabinet.

15. A control system comprising:
a distributed control system operably connected to a communication module for an I/O bank having no Input/Output modules attached thereto;
a valve manifold with a manifold communication module for controlling a plurality of valve stations operably connectable to a plurality of field devices having its manifold communication module serially connected to said communication module through a communication cable; and
said valve manifold being constructed to be pneumatically connected to a plurality of field devices.

16. A control system as defined in claim 15 further comprising:
said manifold communication module connected via a communication backplane of said I/O bank without Input/Output modules to said communication module.

* * * * *